United States Patent [19]

Vancelette

[11] Patent Number: 4,627,156
[45] Date of Patent: Dec. 9, 1986

[54] PLACEMENT HEAD FOR MICRO-COMPONENT ASSEMBLY MACHINE

[75] Inventor: Stanley R. Vancelette, Manchester, N.H.

[73] Assignee: USM Corporation, Farmington, Conn.

[21] Appl. No.: 800,351

[22] Filed: Nov. 19, 1985

Related U.S. Application Data

[63] Continuation of Ser. No. 565,749, Dec. 27, 1983, abandoned.

[51] Int. Cl.[4] .................................. B23P 19/04
[52] U.S. Cl. ................................ 29/740; 29/759; 29/837; 221/278; 406/191
[58] Field of Search .............. 29/740, 739, 741, 759, 29/831–834, 837–839, 564.1; 221/278; 406/88, 191, 76

[56] References Cited

U.S. PATENT DOCUMENTS

| 2,778,691 | 1/1957 | Hazel | 406/88 |
| 3,103,388 | 9/1963 | Cole | 406/88 |
| 3,950,095 | 4/1976 | Bouygues et al. | 29/740 |
| 4,327,483 | 5/1982 | Zemek et al. | 29/759 |
| 4,346,514 | 8/1982 | Makizawa et al. | 29/740 |
| 4,393,579 | 7/1983 | Van Hooreweder | 29/834 |
| 4,476,626 | 10/1984 | Gumbert et al. | 29/834 |

Primary Examiner—Howard N. Goldberg
Assistant Examiner—P. W. Echols
Attorney, Agent, or Firm—Alan N. McCartney

[57] ABSTRACT

A component placement head for positioning microelectronic components on a printed circuit board including an adjustable shelf for receiving the component from a stationary conveyor and accurately positioning the component below the placement nozzle on the head. The nozzle picks up the component from the shelf and aligns the component leads with the conductive lands on the board and then places the component on the board. There is a control limiting the position of the adjustable shelf to assure the component is properly positioned in the nozzle of the placement head.

6 Claims, 3 Drawing Figures

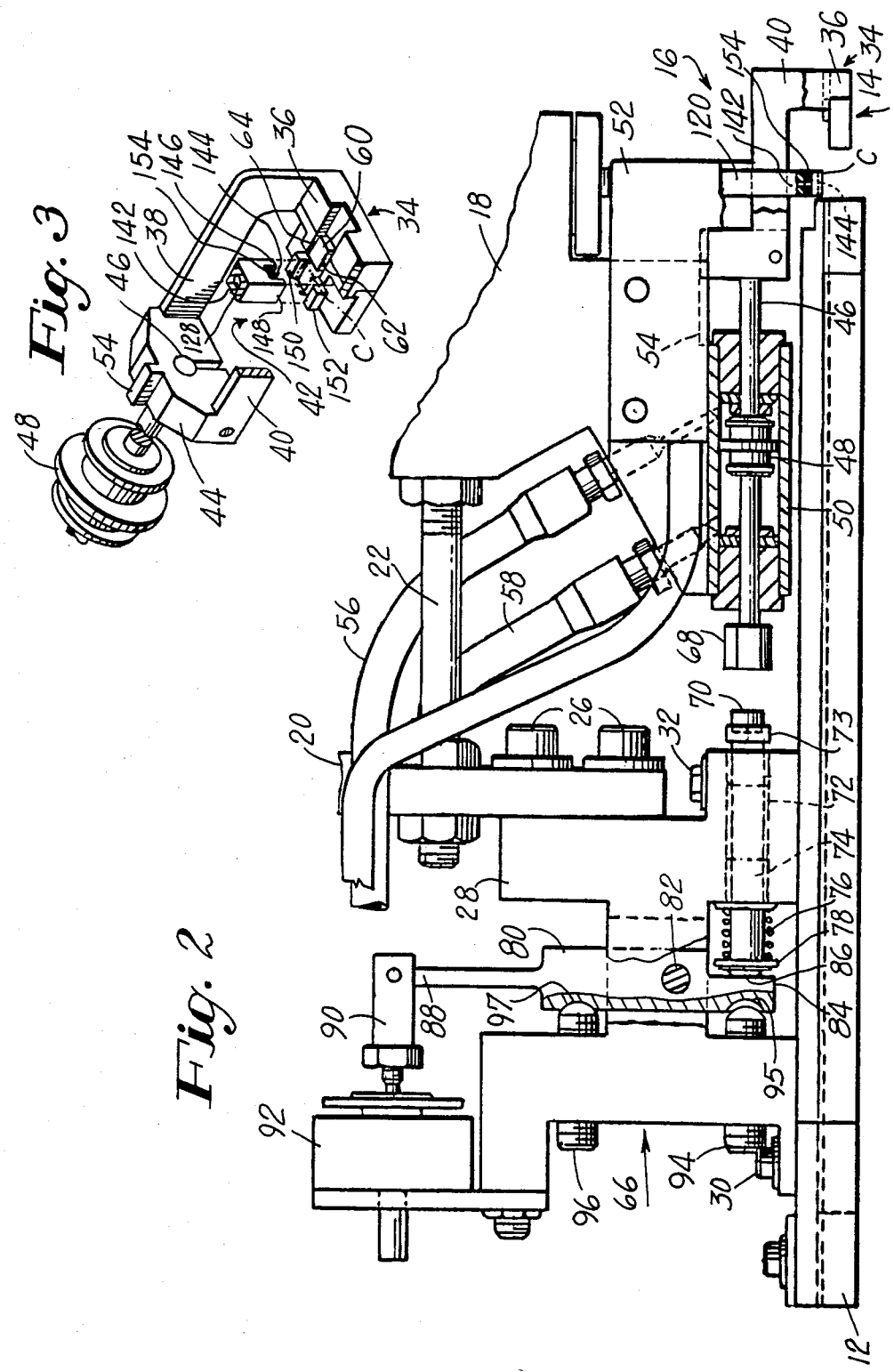

PLACEMENT HEAD FOR MICRO-COMPONENT ASSEMBLY MACHINE

This application is a continuation of Ser. No. 565,749, filed Dec. 27, 1983, and now abandoned.

BACKGROUND OF THE INVENTION (1.) Field of the Invention

This invention relates to placement head apparatus for positioning micro-electronic components on printed circuit boards.

(2.) Summary of the Prior Art

The processing of chip-size electronic components for placement on a printed circuit board is disclosed in commonly assigned U.S. patent application Ser. No. 299,979 filed Sept. 8, 1981, now U.S. Pat. No. 4,501,064. In this system the component is transported from a supply source to a placement head which positions the component between the conductive lands of the circuit on the board. In commonly owned U.S. patent application Ser. No. 479,121 filed Apr. 21, 1983, now U.S. Pat. No. 4,502,829, there is disclosed the software for measuring the size of each component so that the component is properly positioned on the placement head to assure the component is placed between the conductive lands of the board.

In both of the above disclosures, the placement head performs an up and down motion from the position of receiving the component to positioning the component on the board.

There are machines for automatically obtaining a chip-size component from a supply source and transporting the component to a placement head which positions the component on a printed circuit board. Examples of these machines are illustrated in U.S. Pat. Nos. 4,307,832; 4,327,482; 4,346,514, and 4,393,579. None of these prior patented devices however have a component receiving means under the placement head which is positionable to compensate for various size components to assure that the placement head positions the component between the conductive lands on the circuit board.

BRIEF SUMMARY OF THE INVENTION

It is the purpose of this invention to provide a placement head for positioning micro-electronic components between the conductive lands of a printed circuit board.

It is also an object of this invention to provide an apparatus which receives a chip-size component from a conveyor. The apparatus is adjustable in position to compensate for variable size components so that the component is properly positioned with respect to a placement head to assure that the component contacts will be properly positioned on the conductive lands of the board.

It is a further object of this invention to provide a stationary conveyor that transports components to a receiving means beneath a placement head which picks up the component and places it on a printed circuit board. The use of a stationary conveyor with non-moving parts enables the component to be transported from a supply to the adjustable receiving means that accurately positions the component beneath the placement head.

BRIEF DESCRIPTION OF THE FIGURES OF THE DRAWING

FIG. 2 is an enlarged side elevational view, partially in section, of the placement head; and FIG. 3 is a perspective view of the component receiving means of the placement head.

DESCRIPTION OF THE PREFERRED EMBODIMENT

Figure 1:
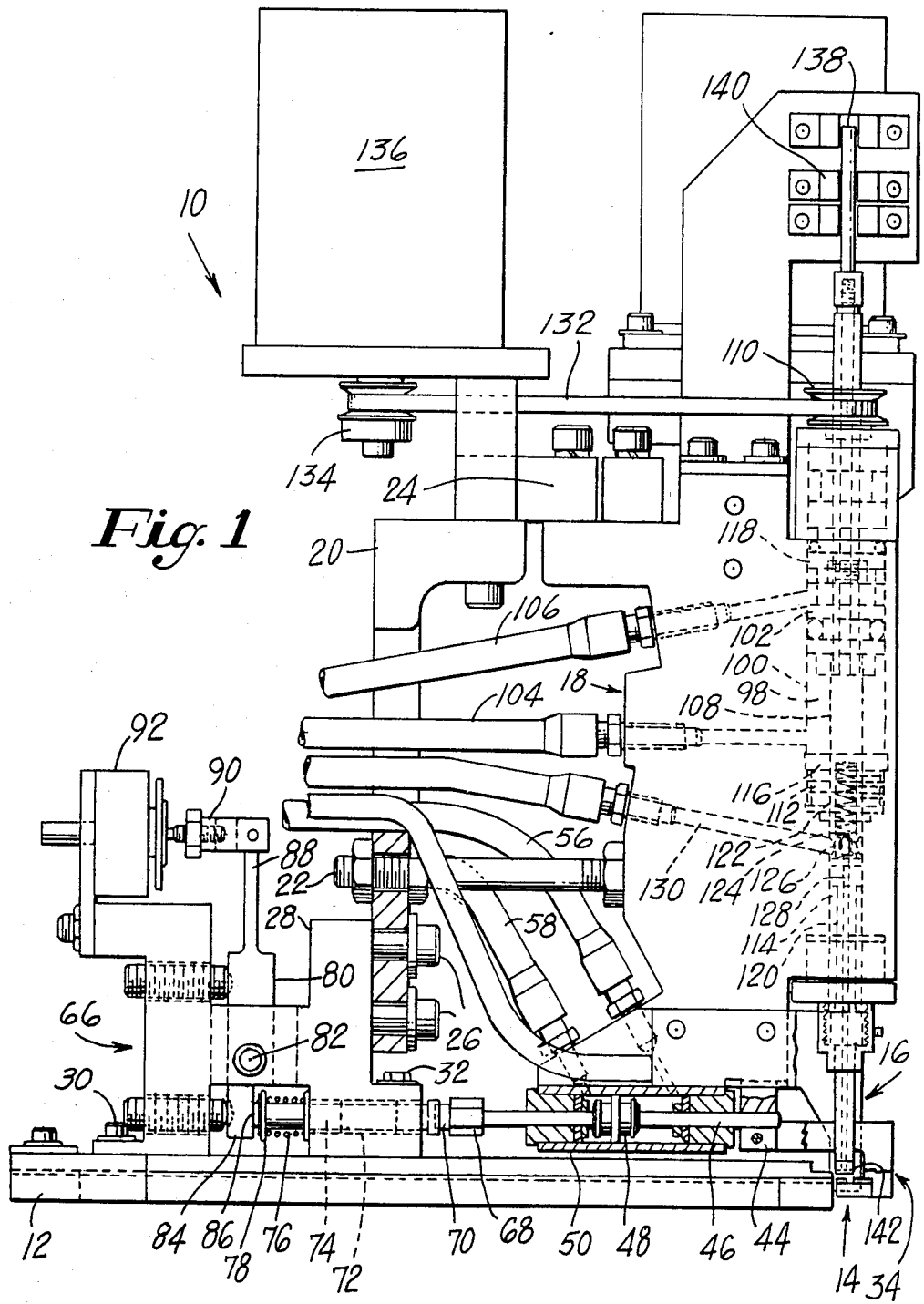
FIG. 1 is an elevational side view of the placement head of this invention.

The micro-component placement machine in which the placement head of this invention is utilized is the type disclosed in the commonly owned U.S. patent application Ser. No. 299,979 filed Sept. 8, 1981. That component placement machine utilizes an air conveyor to transport a component from a source to apparatus receiving the component beneath the placement head which positions the component on the board. In that disclosure and the disclosure of commonly owned U.S. patent application Ser. No. 479,121 filed Apr. 21, 1983, the component size is measured and the component is positioned with respect to the placement head to assure that the leads on the ends of the component are placed on the conductive lands of the circuit on the board. The disclosures of both the aforementioned prior applications are incorporated herein by reference.

Micro-components of the chip type have leads on the end of the component. A given component varies in size and the spacing between the conductive lands on the circuit board varies within a given tolerance. In apparatus for automatically assembling chip-size components to a substrate, it is desirable to provide for the variance in the size of the component as well as the variance in the spacing between the conductive lands of the circuit board. Thus, as the component is received in the apparatus positioning the component below the placement head it is desirable to have such receiving means be accurately adjustable so that the component is positioned in the head to accommodate such variances in component size and the spacing between the conductive lands on the board. It is also desirable to have the receiving means adjust to different sizes of components that may be placed on the board by the placement head.

In the component placement head 10 of the instant invention, an air conveyor 12 transports the component selected from a component supply means (not shown) to a receiving means 14 located below the component placement means 16 of the head. The receiving means 14 is adjustable in position below the placement means 16 to assure that the component is properly positioned within placement means 16 so that the component is placed between the conductive lands of the circuit on the board (as will become apparent hereafter). The placement means 16 is also rotatable for orienting the component. All these functions are computer controlled so that each is performed in proper sequence during the automatic component assembly.

The placement head 10 comprises a housing 18 carried on the machine support (not shown). Housing 18 is mounted to bracket 20 by a stud 22 and a block 24. Mounted to bracket 20 by bolts 26 is a housing 28 which supports the air conveyor 12 by bolts 30 and 32.

The air conveyor 12 is an enclosed track in which the component 'C' is conveyed to the receiving means 14 which is in the form of a shelf 34. The shelf 34 has a base 36 and spaced side brackets 38, 40 which form an open channel 42. The brackets 38, 40 are mounted to a block 44 supported on a shaft 46 of the piston 48 in cylinder 50. The cylinder 50 is part of the housing 18. The block 44 is keyed at 54 to the housing 18. Air lines 56, 58 are connected to the front and rear of cylinder 50 to move the piston 48 and thus shelf 34 back and forth under the placement means 16. The block 52 carries sensing mechanisms of the type disclosed in commonly owned U.S. patent application Ser. No. 479,121 filed Apr. 21, 1983.

The base 36 of shelf 34 has a centerally located stop 60 against which the comppnent comes to rest. The base 36 has spaced grooves 62, 64 adjacent the stop 60 to permit the air from the conveyor to exhaust around both sides of the component to assist in centrally locating the component against stop 60 on the receiving shelf 34.

In the apparatus thus far described, it can be seen that the ability of the component receiving shelf to move back and forth enables the component positioned on the shelf to be accurately placed below the placement means 16. In one position of the shelf, the component is below the placement means 16. The placement means 16 then picks up the component (in a manner described in more detail hereafter) and the piston 48 is moved all the way to the right of the cylinder so that the shelf 34 is moved forward to enable the placement means 16 to move down through the channel 42 and position the component on the board. This position of the shelf 34 is illustrated in FIG. 2.

The rearward position of the shelf 34 (and thus the position of the component under the placement means 16) is controlled by a stop mechanism 66. The shaft 46 extends out of cylinder 50 and carries an adjustable nut 68. The housing 28 has an opening 72 through which an abutment shaft 74 is slidably carried. The end 73 of shaft 74 has a bumper 70 that contacts nut 68 on shaft 46. A spring 76 surrounds shaft 74 and acts against housing 28 and the retaining ring 78 on the end of shaft 74 to bias the shaft 74 rearward (to the left in FIGS. 1 and 2). A lever 80 is pivoted at 82 to the housing 28 and has a lower end portion 84 contacting the end 86 of shaft 74. The upper end 88 of lever 80 is attached to a coupling 90 on the solenoid actuator 92. Spring 76 will pivot lever 80 outwardly moving the lower end portion 84 of lever 80 to the left in FIGS. 1 and 2. This will bias shaft 74 to the left permitting the shaft 46 to travel further to bring shelf 34 further under placement means 16. An adjustable stop 94 seats in recess 95 of lever 80 and limits the pivotal movement of lever 80 in this direction. Operation of the solenoid 92 pivots lever 80 in the opposite direction. Adjustable stop 96 seats in recess 97 in the lever 80 above pivot 82 to limit the position of the lever 80 and thus the forward position of shaft 74 to provide an additional positioning of the shaft 46 and thus shelf 34 in the same fashion as described above.

The placement head 10 comprises a stepped cylindrical bore 98 in housing 18. The upper bore 100 carries a piston 102 which has communication with air lines 104 and 106. A spindle 108 passes through the piston 102 and extends upwardly though a pulley 110. The spindle 108 extends downwardly through a threaded insert 112 and through the lower cylindrical bore 114. Bumpers 116 and 118 are located above and below the piston 102 in the upper bore 100. The spindle 108 slidably receives the placement rod 120 of the head which extends downwardly outward of the housing 18 to a position above the shelf 34. A spring 122 is positioned between the end 124 of placement rod 120 and the inside of the spindle 108 to allow the placement rod 120 to adapt to varying board heights and to buffer the impact of the placement of the component on the board. The spindle 108 contains openings 126 which place the opening 128 in the rod 120 in communication with the vacuum line 130 passing into the lower bore 114.

The pulley 110 is driven by a belt 132 carried on a drive pulley 134 of a motor 136. The motor 136, in response to programmed control, rotates the spindle 108 and rod 120 to align the component held on the end of rod 120 with the desired location on the board.

An extension 138 on spindle 108 coacts with switches 140 on the housing 18 to give an indication of the position of the placement means 16.

The end of rod 120 has a tip or nozzle 142 with a recess or groove 144 having downwardly extending sides 146, 148 into which the chip-size component nests. The groove 144 has an energy absorbing material 154 to buffer the impact of the placement of the component on the board. The nozzle extends down between guides 150, 152 on the shelf 34. This particular configuration of the nozzle 142 assists in aligning the component and keeping the component in plane parallel to the board surface. Further, the component is held between sides 146, 148 when the rod is rotated to align the component.

In one position of operation, a computer control energizes the solenoid 92 to pivot lever 80 to position the shaft 74 (against the action of spring 76). In the other position, the solenoid 92 is not energized and spring 76 positions shaft 74 as previously described. When the air line 56 is pressurized, the piston 48 is moved to the left until the nut 68 on shaft 46 abuts bumper 70. The shelf 34 is now in the preselected position under the placement means 16 for receipt of the particular component to be placed. As the component abuts stop 60, the vacuum from line 130 down through the opening 128 in rod 120 will remove the component from the shelf 34 and position it in the nozzle 142. The air line 58 can then be pressurized and the shelf 34 moved outwardly (by the piston 48 moving to the right) to the position illustrated in FIG. 2. If necessary for proper alignment of the component leads with the lands on the board circuit, the motor 136 can be energized to rotate the placement means 16. Thereafter, pressurizing line 106 will move the piston 102 and thus the placement means 16 to the board. Once the component has been positioned on the board, the vacuum in line 130 is relieved and the component remains on the board. Thereafter, line 104 can be pressurized to move piston 102 upward and raise the placement means to repeat the component placement cycle.

It can thus be seen that with the use of a stationary conveyor which transports the component by air, a component receiving means can be positioned beneath the placement head which is adjustabe in position so that the component is properly positioned on the head. The use of a conveyor with a transport medium with non-moving parts enables the component to be received beneath the placement head and positioned on the board with the greatest accuracy and speed with less handling of the component being required during the entire component assembly operation.

I claim:

1. An apparatus for automatically positioning microelectronic components on conductive lands of a printed circuit board, comprising:
   a. a placement head including means for placing the components on the board;

b. an enclosed conveyor for transporting the components by air to said placement head linearly normal to said placement head;

c. means for receiving the components from said conveyor and positioning the components beneath said placement means;

d. means for adjustably positioning said receiving means with respect to said placement means to accommodate variable sized components to assure each component is properly positioned on said placement means for placement on the conductive lands of the board;

e. means limiting the adjusted position of said receiving means to a predetermined position to assure the accuracy of the position of the component beneath the placement means.

2. The apparatus of claim 1 wherein said receiving means includes a stop against which the component is received, with means permitting the air from the conveyor to bypass said stop to assist in accurately positioning the component in said receiving means.

3. The apparatus of claim 1 wherein said receiving means is a shelf upon which the component is placed for removal by said placement means which bypasses said shelf to position the component on the board.

4. The apparatus of claim 3 wherein said shelf contains a channel through which said placement means passes to place the component on the board.

5. The apparatus of claim 1 wherein said placement means remains in a substantially vertical plane while obtaining the component from said receiving means and placing the component on the board.

6. The apparatus of claim 1 wherein said conveyor is supported on said placement head.

* * * * *